United States Patent [19]

Sinnadurai et al.

[11] Patent Number: 5,223,321
[45] Date of Patent: Jun. 29, 1993

[54] TAPE-AUTOMATED BONDING OF INTEGRATED CIRCUITS

[75] Inventors: F. Nihal Sinnadurai, Woodbridge; David J. Small, Ipswich; Alexander A. Blain, Felixstone; Kenneth Cooper, Ipswich, all of United Kingdom

[73] Assignee: British Telecommunications plc, London, England

[21] Appl. No.: 774,164

[22] Filed: Oct. 15, 1991

Related U.S. Application Data

[63] Continuation of Ser. No. 647,196, Jan. 28, 1991, abandoned, which is a continuation of Ser. No. 914,581, Oct. 3, 1986, abandoned, which is a continuation of Ser. No. 396,076, Jul. 7, 1982, abandoned.

[30] Foreign Application Priority Data

Jul. 17, 1981 [GB] United Kingdom ............ 81-22218

[51] Int. Cl.$^5$ .................................................. B32B 3/10
[52] U.S. Cl. ..................................... 428/138; 428/209; 428/220; 206/330; 29/827; 257/666
[58] Field of Search ............... 428/131, 133, 138, 217, 428/201, 209, 220; 357/70; 29/827; 206/330

[56] References Cited

U.S. PATENT DOCUMENTS

| | | | |
|---|---|---|---|
| 3,517,278 | 6/1970 | Hager | 428/132 |
| 3,623,649 | 11/1971 | Keisling | 428/408 |
| 3,838,984 | 10/1974 | Crane et al. | 29/193.5 |
| 4,063,993 | 12/1977 | Burns | 428/131 |
| 4,494,688 | 1/1985 | Hatada et al. | 428/427 |

OTHER PUBLICATIONS

Semiconductor Bump Plating Comes of Age—by Kenneth D. Baker, et al. -AES 10th Plating in the Electronics Industry Symposium presented by American Electroplaters Society, Inc. Symposium held in San Francisco, Calif. Feb. 1-2, 1983, pp. 1-8.
Chapter 20 entitled "Hardness Testing" by F. H. Reid taken from "Goldplating Technology" by Reid et al, Dec. 1974.
Electrochemical aspects of the plating of gold and composite gold-alumina by C. Buelens et al.—May 1985—vol. 63 part 1. pp. 8-10 + contents.
Electroplating in the Electronics Industry—by I.R.A. Christie, Paper presented at Aston University Metals Engineering Conference, Sep. 1981-Transactions of the Institute of Metal Finishing. pp. 33-40.
Printed Circuits and Electronics Assemblies, edited by C. R. Draper-Robert Drapper Ltd Teddington Oct. 1969, pp. 207-211.
Properties of Electrodeposits—Their Measurement and Significance, by Richard Sard—Bell Laboratories, The Electrochemical Society, Inc.—Document 4. pp. iii, iv, v—246-331. Jan. 1976.
"Precious Metal Plating" by J. Fischer and D. E. Weimer—published by Robert Draper Ltd., Teddington, Dec. 1964—pp. 56,57,149, 150.
"Automated Tape Carrier Bonding for Hybrids" by Dr. Rudolph G. Oswald, et al. Solid State Technology—Mar. 1978, pp. 39-48.
"Beam Tape Carriers—A Design Guide" by Roger L. Cain—Solid State Technology Mar. 1978—pp. 53-58.
"Metallurgical Considerations for Beam Tape Assembly" by A. S. Rose, F. E. Scheline, T. V. Sikina—Solid State Technology—Mar. 1978, 49-52.

(List continued on next page.)

Primary Examiner—Alexander S. Thomas
Attorney, Agent, or Firm—Nixon & Vanderhye

[57] ABSTRACT

A tape for use in tape-automated-bonding of integrated circuits is disclosed. A series of interconnection arrays ("frames") are arranged along the tape, each array being formed by a number of interconnection beams 3. A terminal ("bump") 6 is located on each beam 3 for bonding to a respective interconnection pad 7 of an integrated circuit 8. Conventional bumps are made of gold-plated copper and have uneven and unyielding bonding surfaces which can fail to provide consistent bonds. The bumps 6 of the tape disclosed comprise a conductive material having a Vickers hardness number of 55 or less, and thus have a compliance which facilitates more even bonding. A method of producing the tape is also disclosed.

20 Claims, 2 Drawing Sheets

OTHER PUBLICATIONS

"Gang Lead Bonding Equipment, Materials and Technology" by Thomas L. Angelucci, Sr. Solid State Technology—Mar. 1978, pp. 65-68.

"Bonding systems for Microinterconnect Tape Technology" by Dr. Alan Keizer and Don Brown—Solid State Technology, Mar. 1978, pp. 59-64.

37 Gang Bonding to Standard Aluminized Integrated Circuits with Bumped Interconnect Tape" by Carmen D. Burns and John W. Kanz, Solid State Technology-Sep. 1978, pp. 79-81.

"Proceedings of the 1978 International Microelectronics Symposium" Sep. 25-27 1978—Sponsored by the International Society of Hybrid Microelectronics, pp. 153-156 and 161-168.

"Bumped Tape Automated Bonding (BTAB) Practical Application Guidelines 38 0 by J. W. Kanz, G. W. Braun and R. F. Unger—IEEE Transactions on Components, Hybrids, and Manufacturing Technology, vol. CHMT-2, No. 3, Sep. 1979, pp. 301-308.

"BTAB's Future—An Optimistic Prognosis" by Robert F. Unger and John W. Kanz, Solid State Technology—Mar. 1980, pp. 77-83.

"A Review of Wafer Bumping for Tape Automated Bonding" by Dr. T. S. Liu et al. Solid State Technology—Mar. 1980, pp. 71-76.

Reliability of Tab Products" by Bill Chaffin—Solid State Technology, Sep. 1981—pp. 136-138.

"Protective and Decorative Coatings for Metals," by H. Silman, G. Isserlis, A. F. Averill—published by Finishing Publications Ltd., Teddington, England, Dec. 1978, p. 14.

"Fundamentals of Metal Deposition" by E. Raub ad K. Muller—published by Elsevier Publishing Co. Dec. 1967—pp. 164-166.

Electronics, vol. 53, No. 27, Dec. 1980 New York (US) J. Lyman: "Tape automated bonding meets VLSI challenge" pp. 100-105.

29th Electronic Components Conference, May 14-16, 1979 Cherry Hill, N.J. (US) S. Sato et al.: "A new approach to reliability built-in connections for LSI terminals" pp. 94-98.

Brown, "BTAB—The Elusive Success", International Microelectronics Symp., Dec. 1980, New York, N.Y. pp. 238-244.

TAPE-AUTOMATED BONDING OF INTEGRATED CIRCUITS

This is a continuation of application Ser. No. 07/647,196, filed Jan. 28, 1991, now abandoned, which in turn is a continuation of application Ser. No. 06/914,581, filed Oct. 3, 1986, now abandoned, which in turn is a continuation of application Ser. No. 06/396,076, filed Jul. 7, 1982, now abandoned.

BACKGROUND OF THE INVENTION

This invention relates to a tape for use in tape-automated-bonding of integrated circuits, and to a method of producing such a tape.

Tape-automated-bonding is a known method of making connections to the interconnection pads of integrated circuits. A length of tape (such as conventional 35 mm film base) carries a series of interconnection arrays (also known as "frames") for integrated circuits. Each array comprises a number of etched copper "beams" (also known as "leads" or "fingers"), each beam being arranged for bonding with a respective interconnection pad of an integrated circuit. The bond between each beam and interconnection pad is made via a terminal (known as a "bump") which is formed either on the interconnection pad or at a corresponding location on the beam. Re-flow soldering or thermocompression is used to form the bond. Bumps formed initially on the interconnection pads of an integrated circuit are usually provided while the integrated circuit is still part of a larger wafer, and the provision of bumps is known as "wafer bumping".

Once bonded to the tape, individual integrated circuits and their respective interconnection arrays are excised from the tape for packaging—for example, connection to a "lead frame" of a conventional dual-in-line integrated circuit package, particularly a moulded plastics package. Alternatively, the tape-bonded integrated circuits may be directly connected to a hybrid substrate or printed circuit board.

The use of tape facilitates automation of the bonding process and automatic testing of bonded chips still on the tape (if the beams are electrically isolated). For such automatic testing, the tape is loaded on a reel-to-reel transport mechanism associated with an automatic testing machine.

Tapes are available for use in tape-automated-bonding of specified integrated circuits. These tapes have interconnection arrays which are appropriate for the specified integrated circuits, the etched copper beams of the arrays each being provided with, for example, a gold-plated copper bump. Such tapes are known as "bumped tapes". Some integrated circuits are also available having interconnection pads provided with gold-plated bumps for bonding to tape. Such integrated circuits are known as "bumped chips".

With known bumped tapes, however, the bumps can fail to provide consistently satisfactory bonds. We observed that a reason for this is that the bumps of, for example, copper formed on the copper beams have relatively hard, uneven bonding surfaces which, even after gold-plating, remain uneven and unyielding, causing poor adhesion to the aluminium, or other metal, interconnection pads of the integrated circuit.

DISCLOSURE OF THE PRESENT INVENTION

According to a first aspect of the invention there is provided a tape for use in tape-automated-bonding of integrated circuits, the tape being provided along its length with a series of interconnection arrays, each array comprising a plurality of interconnection beams for bonding with interconnection pads of an integrated circuit, a terminal being provided on each interconnection beam for making a bond between that beam and a respective interconnection pad of an integrated circuit, each terminal comprising a conductive material which has a Vickers hardness number of 55 or less, such that the terminal has a compliance which permits substantially even bonding of an entire bonding surface thereof to its respective interconnection pad in use.

Each terminal could be entirely formed by the conductive material.

The conductive material could be gold, in which case each terminal could have a core of relatively hard gold and an outer layer of relatively soft gold.

The conductive material could instead be one of a plurality of dissimilar metals which form each terminal.

According to a second aspect of the invention there is provided a method of producing such a tape, the method including the step of depositing a material or materials, for forming the terminals, only at locations on the tape which correspond to interconnection pads of the integrated circuit.

The material or materials could be deposited by electroplating, or, instead, a respective substantially spherical mass of the material or materials could be deposited at each of the said locations on the tape and bonded thereto.

The invention will now be described, by way of example, with reference to the accompanying drawings, in which:

BRIEF DESCRIPTION OF THE DRAWING FIGURES

DISCLOSURE OF A PREFERRED EMBODIMENT OF THE INVENTION

Figure 1:
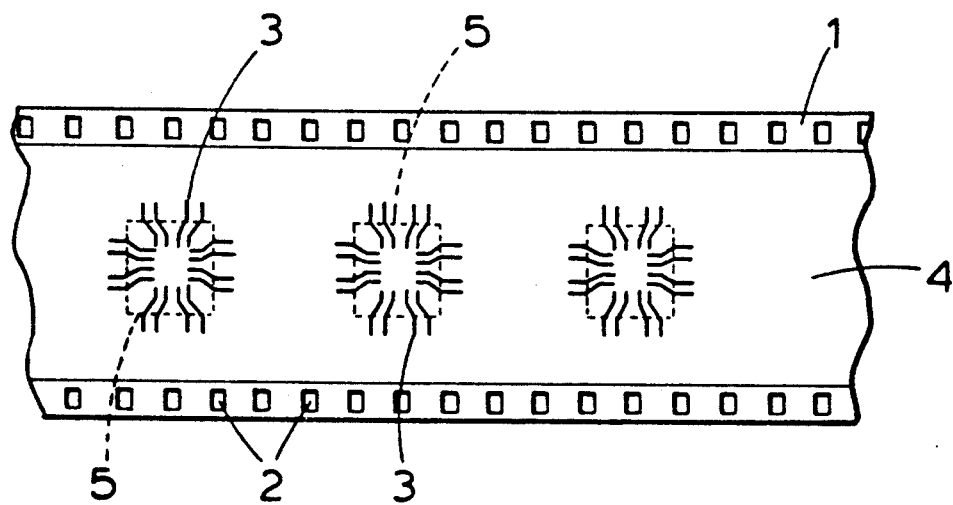
FIG. 1 shows a plan view of a portion of tape for tape-automated bonding, the portion including three interconnection arrays.

Referring to FIG. 1, a tape for tape-automated-bonding comprises a flexible, insulating carrier 1—in this case a 35 mm film base formed by a strip of polyimide which is provided with a row of perforations 2 along both of its edges. Each of the three interconnection arrays shown comprises a plurality of gold-plated copper interconnection beams 3 which have been produced by gold plating the required array pattern and then etching a copper layer (which formerly occupied a region 4 between the two rows of perforations 2). An aperture (also known as a "window") approximately 8 mm square is formed in the carrier 1 beneath each array to receive an integrated circuit to be bonded to the array. The dimensions of the windows depend on the dimensions of the integrated circuits to be bonded.

These windows are indicated by the dotted lines 5 in FIG. 1.

Figure 2:
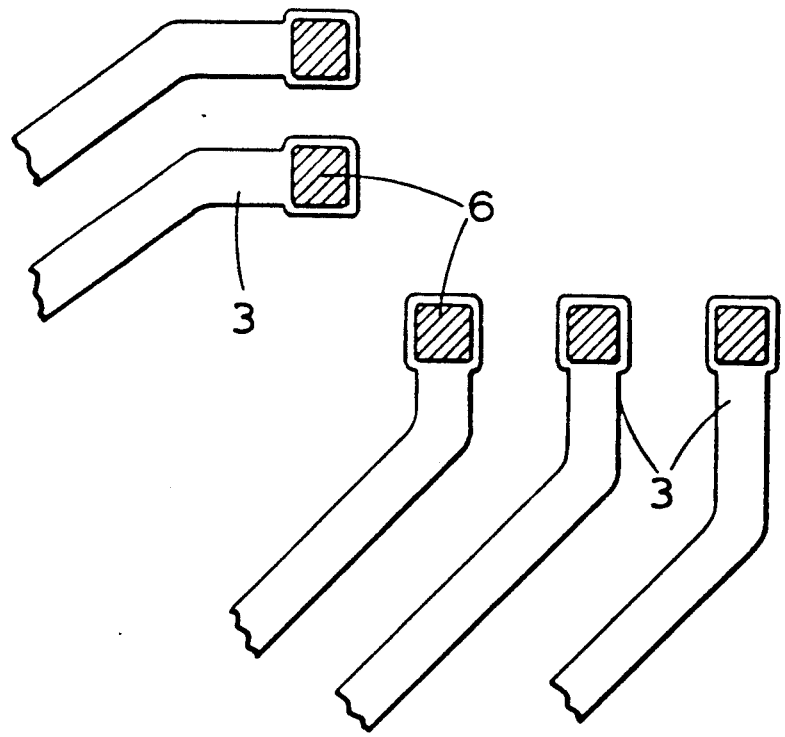
FIG. 2 shows a detailed view of an inner corner of an interconnection array of the tape shown in FIG. 1.

Referring to FIG. 2, the inner ends of five beams 3 are shown. The innermost end of each beam 3 carries a terminal (or "bump") 6 which is made of a mass of gold having a shaped upper bonding surface for bonding with an interconnection pad of an integrated circuit.

Figure 3:
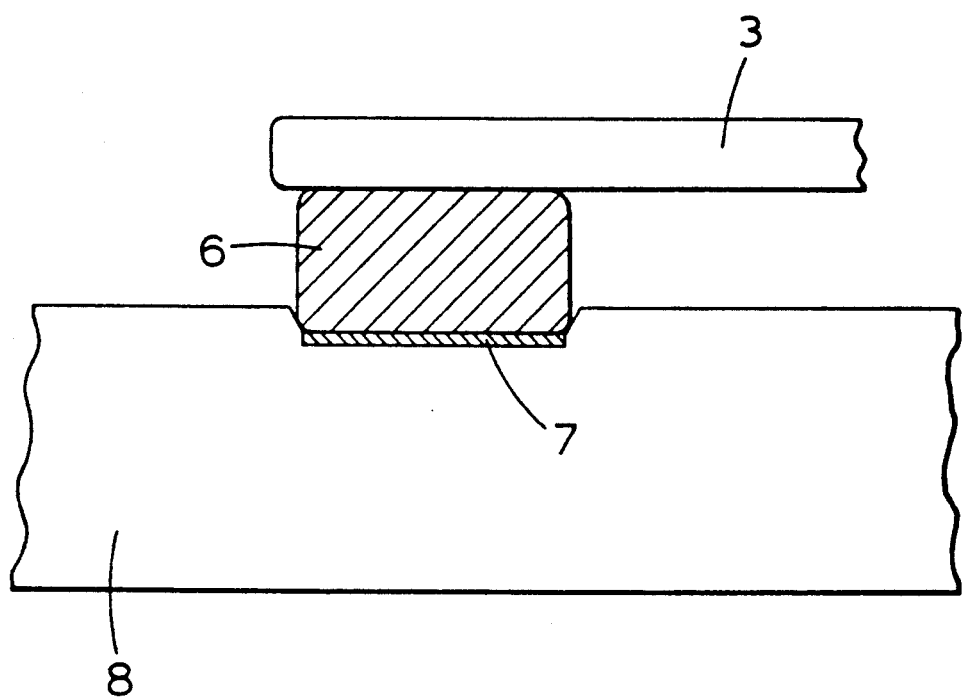
FIG. 3 shows a vertical, sectional view of a bond between an inner end of a beam of an interconnection array of the tape shown in FIG. 1 and an interconnection pad of an integrated circuit (only part of which is shown).

In FIG. 3 a gold bump 6 at an inner end of a beam 3 is bonded to an interconnection pad 7 of an integrated circuit 8, which pad could, for example, be made of aluminium. In this case, the beam 3 (and thus the tape, which is not shown) is located above the integrated circuit 8 with its bump 6 facing downwards. Bonding of the bump 6 to the pad 7 is achieved by thermocompression.

One method of forming the bumps 6 on the beams 3 (the bumps 6 and beams 3 being made of dissimilar materials) involves forming the bumps 6 separately from the beams 3 and attaching them thereto as a secondary operation. This method can be achieved by producing very small gold spheres and bonding them to the desired locations on gold-plated copper tape. Such a method is known as an "additive" method.

Another, semi-additive method involves electroplating and is performed in the following steps.

Initially, a tape, intended for tape-automated bonding, is prepared. This tape comprises the conventional 35 mm film base 1 mentioned above, to the region 4 of which a copper layer has been fixed by adhesive. The tape is prepared by first being physically abraded. A liquid resist is applied to the windows and baked hard. The surface of the copper layer 4 is then conditioned in an acid bath.

After preparation, the tape is laminated with a 25 μm layer of negative dry-film photo-resist. A mask of the required interconnection array is next used for an exposure, and the exposed image is developed. The resulting, exposed copper beams 3 of the array are chemically cleaned and baked and then reverse plated in concentrated orthophosphoric acid. The tape is next washed in deionised water and conditioned in a 10% orthophosphoric acid bath. The beams 3, having been prepared in this way, are now ready for electroplating with gold.

After completion of the gold-plating ("flashing") of the beams 3, the gold bumps 6 can be formed.

Firstly the remaining negative dry-film photo-resist is stripped off. The exposed copper is conditioned in an acid bath after which a 50 μm layer of negative dry-film photo-resist is applied and a mask of the required bump locations on the array is used for an exposure. The resultant exposed bump image is developed and the exposed gold flashed pads are chemically cleaned and baked. Next the bump images are conditioned in a 10% orthophosphoric acid bath which is followed by a rinse in deionised water. Finally the images are gold plated until bumps 6 having a thickness of approximately 35 μm have been built up, the walls formed in the applied photo-resist defining the shape of the bumps 6.

The negative photo-resist is stripped off. The windows are then re-sealed with liquid resist and baked hard. Finally the unplated copper layer 4 is removed by etching in ferric chloride. Any resist remaining on the back of beams 3 is removed in an alkaline stripper.

The gold bumps 6 are particularly suited mechanically and electrically to the thermocompression bonding process used, since the soft gold used is a compliant material which has Vickers hardness number of 55 or less (typically 35) and which is more ductile than the relatively hard materials used for conventional bumps (for example, the copper commonly used has a typical Vickers hardness number of 90). Thus, the gold bumps 6 are capable of giving adhesion to integrated circuit pads which is superior to that provided by conventional bumps, the bonding achieved being substantially even over the entire bonding surfaces of the bumps. In order to provide good bonds by shearing the bonding surfaces, each bump should preferably have a rounded shape.

Each bump 6 could also be built-up by firstly depositing a core of relatively "hard" gold and secondly depositing an outer layer or relatively "soft" gold in order to provide a compliant bump. In practice, gold can have a Vickers hardness number in the range from 30 to 100 or more.

Other such compliant materials could be used in place of gold to form each, or part of each, bump. Also, bumps could be formed by the successive electro-plating of several dissimilar metals, in order to optimise the compliance and the electro-chemical characteristics of the bumps. For example, bumps comprising tin and lead could be built up.

We claim:

1. A tape for use in bumped tape-automated-bonding of integrated circuits, the tape being provided along its length with a series of interconnection arrays, each array comprising a plurality of interconnection beams for bonding with interconnection pads of an integrated circuit;

a terminal being provided on each interconnection beam for making a bond between that beam and a respective interconnection pad of an integrated circuit;

each terminal comprising gold which has a Vickers Hardness Number of 55 or less, such that the terminal has a compliance which permits substantially even bonding of an entire bonding surface thereof to its respective interconnection pad in use;

wherein each terminal comprises a core of gold having a first hardness and an outer layer of gold having a Vickers Hardness Number of 55 or less, the hardness of said outer layer 2. A tape having bumped conductive terminal on the ends of conductive leads for use in bumped tape-automated bonding of said electrical leads to the interconnection pads of integrated circuit chips, said tape comprising:

a flexible elongated carrier material; and a plurality of arrays of conductive leads adhesively affixed to said carrier material and distributed therealong with terminal ends of leads in each array being disposed to mate with a corresponding array of interconnection pads on an integrated circuit chip;

each said terminal end having a raised bump of conductive material which includes a substantial mass of electro-plated conductive material having a Vickers Hardness Number of 55 or less disposed at its outer surface for ready and reliable thermocompression bonding to a corresponding one of said interconnection pads.

3. A tape as in claim 2 wherein the entirety of said raised bump is formed of electro-plated conductive material having a Vickers Hardness Number of 55 or less.

4. A tape as in claim 2 wherein said electro-plated material includes electro-plated gold having a Vickers Hardness Number of 55 or less.

5. An elongated tape carrier having a series of arrayed conductive electrical beam leads disposed thereon with inner ends of such leads being arrayed about and partially within a succession of open windows in the carrier and configured for use in bumped-tape-automated-bonding (BTAB) of the arrayed inner ends of said beam leads to mating arrays of integrated circuit connection pads, each of said inner ends of the beam leads being characterized by:
   a compliant bump of electro-plated gold having a Vickers Hardness Number of 55 or less and being sufficiently compliant to produce substantially even bonding of an entire bonding surface thereof thereby enabling consistently satisfactory reliable simultaneous thermocompression bonding of an entire beam lead array to a mating array of integrated circuit connection pads in a BTAB process.

6. An elongated tape carrier as in claim 5 wherein said compliant bump in its entirety includes substantially only said electro-plated gold having a Vickers Hardness Number of 55 or less.

7. An elongated tape carrier as in claim 5 wherein said compliant bump has a height of approximately 35 μm.

8. A tape for use in bumped tape-automated bonding of integrated circuits, the tape being provided along its length with a series of interconnection beams for bonding with interconnection pads of an integrated circuit, a terminal being provided on each interconnection beam for making a bond between that beam and a respective interconnection pad of an integrated circuit, characterized in that each terminal is formed entirely of deposited material, and in that each terminal comprises at least an outer layer of a conductive material having a Vickers Hardness Number of 55 or less to render the terminal compliant.

9. A tape according to claim 8 wherein the conductive material is electroplated.

10. A method of producing a tape according to claim 8, the method including the step of depositing a material or materials, for forming the terminals, only at locations on the tape which correspond to interconnection pads of the integrated circuit.

11. A method according to claim 10, wherein the material or materials is or are deposited by electro-plating.

12. A method according to claim 10, wherein gold is used as the material.

13. A method according to claim 11 wherein gold is used as the material.

14. In a tape for bumped tape-automated bonding of integrated circuits having a series of interconnection arrays disposed along a length of the tape, with each array including a plurality of conductive interconnection beams for bonding with interconnection pads of the integrated circuit, with a terminus on each interconnection beam for making a bond between the beam and a respective interconnection pad of an integrated circuit, the improvement consisting of an entire gold bump electroplated in situ on the terminus of the beam and wherein the gold has a Vickers Hardness No. of 55 or less, such that the bump has a compliance which permits substantially even bonding of an entire bonding surface thereof to its respective interconnection pad in use.

15. An elongated tape carrying successive arrays of bumped conductive interconnection beams for use in bumped tape automated bonding (BTAB) to corresponding arrays of conductive interconnection pads on integrated circuits, said tape comprising:
   a series of conductive interconnection arrays disposed along a length of said tape, each said array including a plurality of conductive interconnection beams for bonding with a corresponding array of conductive interconnection pads on an integrated circuit;
   each said conductive interconnection beam including a compliant electro-plated bump of gold at a terminal end thereof, said electro-plated bump having a Vickers Hardness Number of 55 or less and being sufficiently compliant to produce substantially even bonding of an entire bonding surface thereof to a respectively corresponding interconnection pad of the integrated circuit.

16. A tape according to claim 15 wherein the electro-plated gold has a Vickers Hardness Number within a range of 55-30.

17. A tape according to claim 15 wherein the electro-plated gold has a Vickers Hardness Number of about 35.

18. An elongated tape carrying successive arrays of bumped conductive interconnection beams for use in bumped tape automated bonding (BTAB) to corresponding arrays of conductive interconnection pads on integrated circuits, said tape comprising:
   a series of conductive interconnection arrays disposed along a length of flexible insulating tape;
   each said array including a plurality of conductive interconnection beams with terminal ends for bonding with a corresponding array of conductive interconnection pads on an integrated circuit; and
   each said conductive interconnection beam including (a) a copper substrate adhesively affixed to said tape and flash-electro-plated with a first gold surface coating thereover, and (b) an electro-plated gold bump that is electro-deposited on top of said first electro-plated gold surface and which electro-plated gold bump is confined to only a terminal end portion of the beam;
   said electro-plated gold bump having a Vickers Hardness Number of 55 or less and being sufficiently compliant to produce substantially even bonding of an entire bonding surface thereof to a respectively corresponding interconnection pad of the integrated circuit.

19. An elongated tape as in claim 18 wherein the electro-plated gold bump has a Vickers Hardness Number within a range of about 55-30.

20. An elongated tape as in claim 18 wherein the electro-plated gold bump has a Vickers Hardness Number of about 35.

* * * * *